United States Patent [19]

Bullington

[11] Patent Number: 5,053,994

[45] Date of Patent: Oct. 1, 1991

[54] METHOD AND APPARATUS FOR APPLYING A POTENTIAL DIFFERENCE ACROSS A SELECTED REGION OF A SUBSTRATE

[75] Inventor: Jeff A. Bullington, Albuquerque, N. Mex.

[73] Assignee: Radiant Corporation, Albuquerque, N. Mex.

[21] Appl. No.: 387,658

[22] Filed: Jul. 31, 1989

[51] Int. Cl.$^5$ .................... G11C 11/42; G11C 13/04
[52] U.S. Cl. .................... 365/112; 365/106; 365/120
[58] Field of Search ............ 365/109, 112, 106, 120, 365/127

[56] References Cited

U.S. PATENT DOCUMENTS 4,041,477 8/1977 Drenckhan .

Primary Examiner—Terrell W. Fears
Attorney, Agent, or Firm—McCubbrey, Bartels, Meyer & Ward

[57] ABSTRACT

A method for selectively applying a voltage to selected points on a surface is disclosed. The method utilizes a layer of photo-conductive material in contact with the surface in question. The layer of photo-conductive material is illuminated in the region immediately above the selected points so as to cause the voltage on an electrode bonded to one surface of the photo-conductive region to be electrically connected to the selected points.

2 Claims, 2 Drawing Sheets

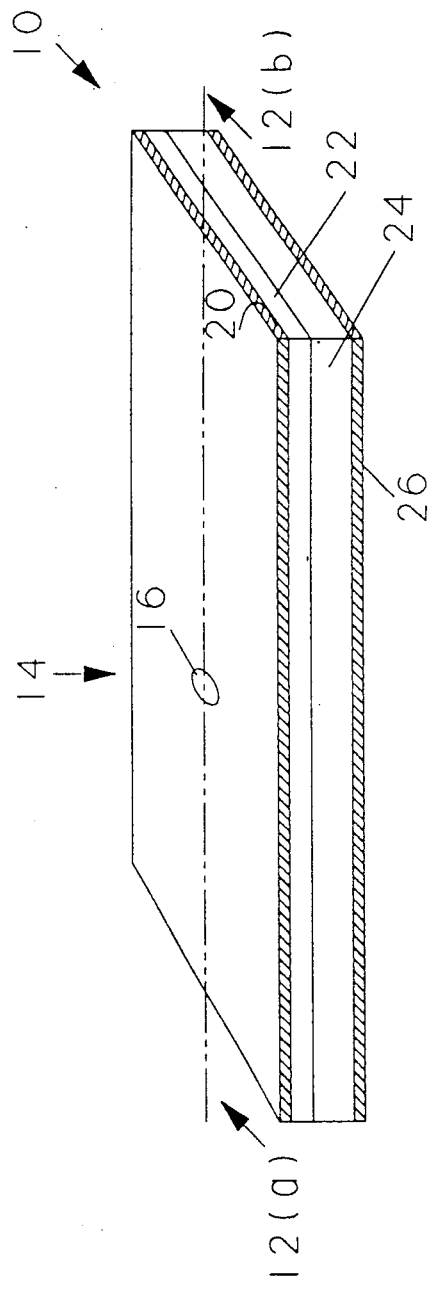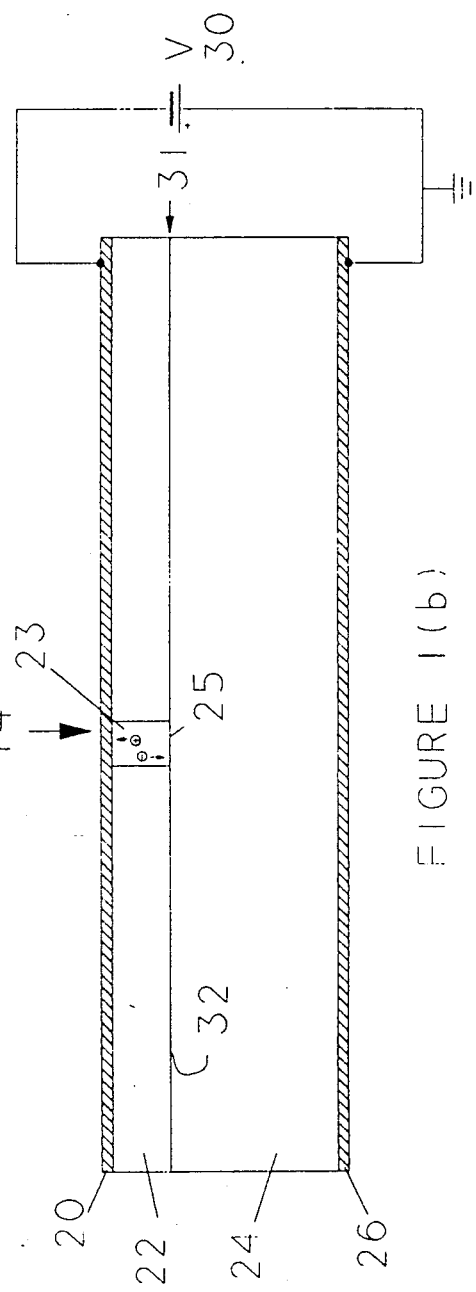

METHOD AND APPARATUS FOR APPLYING A POTENTIAL DIFFERENCE ACROSS A SELECTED REGION OF A SUBSTRATE

FIELD OF THE INVENTION

The present invention relates to electro-optical systems, and more particularly, to a novel method of applying an electric field across a selected portion of a substrate.

Consider a layer of material which includes circuit elements connected between the top and bottom surface thereof. It is advantageous to be able to selectively apply a potential difference across specified ones of said circuit elements while leaving the remaining circuit elements unconnected. The circuit elements can be conventional elements such as transistors and resistors or they can be regions in an otherwise homogenous material.

In this latter case, the potential difference may be utilized to alter the state of a particular region in the layer or to measure the state of said region. For example, if the material in question were a ferro-electric material, information can be stored at specific locations in the layer by altering the phase or polarization of the material at the location in question. It can be shown that the phase of the material can be altered by applying an electric field of sufficient magnitude to the region.

The prior art method for applying the potential difference in question involves plating conductors on the surfaces of the layer. A separate conductor must be plated from the potential source to each location on the layer which is to be capable of separate energization. Such plating operations require separate masking and plating steps. In addition, if the size individual regions is small, there may not be sufficient surface area to provide a conductor to each region without utilizing a plurality of layers of conductors separated by insulating layers.

Broadly, it is an object of the present invention to provide an improved method and apparatus for applying a potential difference across a selected portion of a substrate.

It is another object of the present invention to provide a method and apparatus for applying a potential difference across a selected portion of a substrate wherein individual conductors connecting each portion of the substrate to be individually energizatble to the potential source are not required.

These and other objects of the present invention will become apparent to those skilled in the art from the following detailed description of the invention and the accompanying drawings.

SUMMARY OF THE INVENTION

The present invention comprises a method for applying a voltage to a selected area of a surface. A layer of photo-conductive material is provided which is in contact with said surface. The photo-conductive material is an insulator in the absence of light having a wavelength less than a predetermined wavelength. An electrode is bonded to the surface of said layer of photo-conductive material which is not in contact with said surface. The electrode comprises a layer of conductive material. The voltage is applied to the selected area by illuminating the layer of photo-conductive material in the region between said electrode and said selected area with light having a wavelength less than or equal to said predetermined wavelength.

BRIEF DESCRIPTION OF THE DRAWINGS

FIG. 1(a) is a perspective view of a memory structure according to the present invention.

FIG. 1(b) is a cross-sectional view of the memory structure shown in FIG. 1(a).

DETAILED DESCRIPTION OF THE INVENTION

Figure 2:
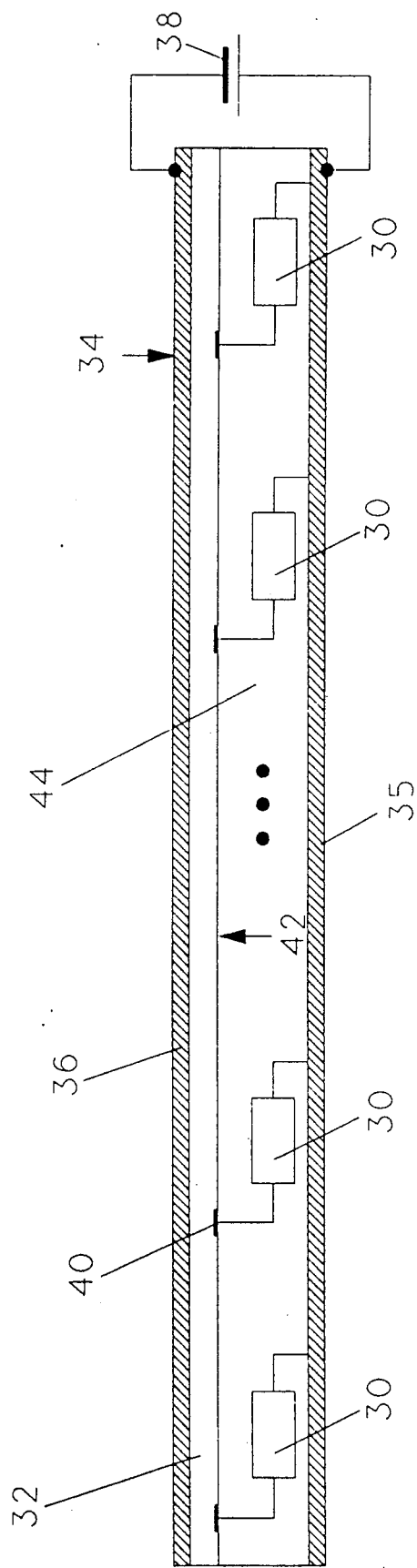
FIG. 2 illustrates the manner in which an addressing layer according to the present invention could be utilized to selectively energize circuit elements.

The present invention may be more easily understood with reference to a specific example in which it may be utilized. Consider a planar substrate in which one wishes to apply a potential difference only across a specified region thereof while leaving other regions of said substrate unaffected. For example, the substrate in question could be a lead lanthanum zirconate titanate (PLZT) platter from a read/write optical disk in which information is stored by changing the phase of PLZT material. A section of such a platter is shown in FIGS.(a) 1a and (b) at 10. FIG. 1(a) is perspective view of a section of such a platter, FIG 1(b) is a cross-sectional view of the section shown in FIG. 1, the cross-section being taken through line 12a–12b.

The individual data bits are stored on the platter by changing the phase of the PLZT material. Each bit corresponds to a different location on the platter. A one is stored by causing the material at the location in question to be in the ferro-electric (FE) phase. A zero is stored by causing the material to be in the anti-ferro-electric (AFE) phase. It can be shown that the material can be caused to change from FE phase to the AFE phase by subjecting the material to an electric field having a sufficient field strength. Similarly, the material can be changed from the AFE phase to the FE phase by subjecting the material at the location in question to the opposite electric field. When writing data corresponding to a specific bit, one must subject only the location corresponding to the bit in question to the electric field, while leaving all other locations unaffected.

A platter utilizing the present invention includes two layers, an addressing layer 22 according to the present invention and a storage layer 24. An optically transparent electrode 20 is bonded to the surface addressing layer 22 which is not bonded to storage layer 24. Similarly, an electrode 26 is bonded to the surface of storage layer 24 which is not bonded to addressing layer 22. A potential difference applied between electrodes 20 and 26 may be applied to a selected region of storage layer 24 by illuminating the region of addressing layer 22 between the selected area and electrode 20. This is preferably accomplished by illuminating electrode 20 immediately above said selected region with light of a predetermined wavelength. The illumination connects electrode 20 to the surface of storage layer 24 at the selected point.

An exemplary light spot produced by illuminating the surface of addressing layer 22 with light beam 14 is shown at 16 in FIG. 1. Light beam 14 may be directed to any spot on addressing layer 22 by moving light beam 14 relative to platter 10. For example, platter 10 could be made to rotate under a laser which moves radially relative to the center of rotation in a manner analogous to the read/write arms of conventional magnetic disks utilized in computers and the like.

In a platter utilizing the present invention, addressing layer 22 must be photoconductive for light of wavelengths less than or equal to that of the light in light beam 14 and an insulator when not exposed to light of these wavelengths. If this condition is met, then addressing layer 22 will generate charge carriers in the region 24 immediately under spot 16 when illuminated. These carriers will effectively short out addressing layer 22 in the illuminated region thereby causing the potential on electrode 20 to be transferred to the surface of storage layer 24 as shown at 25.

If storage layer 24 is an insulator, addressing layer 22 must have one additional property, namely, it must have a dielectric constant which is small compared to that of storage layer 24. As will be apparent to those skilled in the electronic arts, in the absence of light beam 14, a potential difference applied between electrodes 20 and 26 will be divided between addressing layer 22 and storage layer 24 in a manner analogous to the division of an electric potential between two capacitors connected in series. This division depends on the respective thicknesses and dielectric constants of addressing layer 22 and storage layer 24. The dielectric constants and thicknesses must be adjusted such that the fraction of the potential difference appearing across storage layer 24 in the absence of light on addressing layer 22 is less than the potential difference needed to change the state of storage layer 24.

The wavelength at which the addressing layer 22 becomes photo-conductive depends on the material from which it is made and on whether or not the material is doped. Undoped PLZT materials are known to have a band-gap energy of 0.35ev, causing carrier generation at wavelengths below 0.36 microns. Hence, if light beam 20 has a wavelength less than 0.36 microns an undoped layer of PLZT material may be used for addressing layer 22. If longer wavelengths are required, a layer of doped PLZT may be used.

The photo-sensitivity of the addressing layer will be determined by the dopant chosen and the concentration thereof in the addressing layer. For example, the combination of addressing layer 22 and storage layer 24 can be fabricated by ion implanting the top surface of a PLZT wafer with $1 \times 10^{15}$ (1.3 Mev) Al/cm$^2$ and $2.4 \times 10^{15}$ (1.3 Mev) Ne/cm$^2$. The ion implanted region then becomes addressing layer 22 and the non-implanted region becomes storage layer 24. The resulting addressing layer is photo-conductive for light having a wavelength of 0.48 microns or less.

The ion implantation described above may also be used to control the dielectric constant of the addressing layer. As noted above, in some embodiments of the present invention, it is advantageous to have an addressing layer with a dielectric constant which is small compared to that of the addressing layer. If has been found experimentally that ion implantation of the PLZT material significantly reduces the dielectric constant of the PLZT. Hence, when the addressing layer and storage layer are created by ion implantation of a PLZT wafer, a structure having an addressing layer with a dielectric constant which is small compared to that of the storage layer is created.

Other methods of controlling the relative dielectric constants of the addressing and storage layers will be apparent to those skilled in the art. For example, If the addressing layer also comprises a PLZT layer, the PLZT be sintered to a lower temperature than the storage layer. In this case, the storage layer would be sintered at a temperature which results in a perovskite structure being formed and the addressing layer would be sintered at a temperature which results in pyrochlore phase being formed. The perovskite storage medium will, in general, have a dielectric constant of approximately 500 to 2000. A PLZT pyrochlore phase material will have a dielectric constant of typically 20 to 50.

The dielectric constant may also be varied by choosing a different composition of PLZT material. For example, a composition of 0/0/100, i.e., lead titanate has a dielectric constant of about 100; whereas, a composition of 8/40/60 has a dielectric constant of about 700.

Although the above discussion has utilized a platter from an optical disk as an exemplary system for explaining the principles of the present invention, it will be apparent to those skilled in the art that the present invention may be utilized in a large variety of circuitry. The present invention comprises a means for applying an electrical potential at one or more points on a surface in response to the illumination of the area immediately above the surface. As such, the present invention is particularly well suited to the solution of addressing problems such as the optical disk discussed above and to optical pattern recognition systems.

FIG. 2 illustrates the manner in which an addressing layer according to the present invention could be utilized to selectively actuate circuit elements in a planar array of said elements. This type of system is applicable to optical pattern recognition systems in which the illumination is provided by projecting an image onto the addressing layer. In this case, the circuit elements perform the "recognition" calculations on the image.

In this example, a planar array of circuit elements 30 is covered by an addressing layer 32 according to the present invention. An image is projected on the upper surface 34 of addressing layer 32. The upper surface of addressing layer 34 includes an electrode 36 which is connected to a voltage source 38. Each circuit element includes a terminal 40 which is in contact with the bottom surface 42 of addressing layer 32. A circuit element 30 is energized by supplying a potential difference between terminal 40 and electrode 35 which is connected to each of the circuit elements 30. Voltage will be applied to those terminals 40 which are under locations exposed to light. These circuit elements will be connected to voltage source 38 in a manner analogous to the application of a voltage across storage layer 24 described above. Those terminals which are under non-illuminated regions will not receive voltage. The circuit elements may be fabricated within substrate 44 as shown in FIG. 2 or on the surface thereof in the regions between those to be illuminated.

In the above examples, the addressing layer was placed on only one side of the surface to which the voltages were to be applied. It will be apparent to those skilled in the art that embodiments in which an addressing layer is placed on each side of a layer are also useful. In this case, voltage will be applied across the layer only in those locations in which the addressing layer on each side is illuminated. Such embodiments are particularly useful in applications in which calculations based on two optical patterns are to be performed. Here one pattern would be used to illuminate one addressing layer, and the other would be used to illuminate the other addressing layer. By a proper choice of the circuitry in the layer sandwiched between the two addressing layers, a circuit for comparing two images may be created.

In the above examples, the photo-conductive addressing layer was illuminated from the top utilizing an electrode which was transparent to the light in question. It will be apparent to those skilled in the art, that the addressing layer could be illuminated from the bottom provided the layer to which the voltage is to be applied is transparent to the light in question.

Accordingly, a novel method for applying voltage to selected portions of a surface has been described. Various modifications to the present invention will become apparent to those skilled in the art from the foregoing description and accompanying drawings. Accordingly, the present invention is to be limited solely by the scope of the following claims.

What is claimed is:

1. A method for applying a voltage to a selected circuits in a planar array of circuit elements, each said circuit element comprising a first and second terminals, said method comprising the steps of:

providing a layer of photo-conductive material in contact with said first terminals, said material being an insulator in the absence of light having a wavelength less than a predetermined wavelength;

providing a first electrode bonded to the surface of said layer of photo-conductive material which is not in contact with said first terminals, said electrode comprising a layer of conductive material;

providing a second electrode in contact with said second terminals;

providing a potential difference between said first and second electrodes; and illuminating said layer of photo-conductive material in the region between said electrode and said first terminal of said selected circuit elements with light having a wavelength less than or equal to said predetermined wavelength.

2. The method of claim 1 wherein said electrode is transparent to light of said predetermined wavelength and wherein said step of illuminating said layer of photo-conductive material comprises illuminating the portion of said electrode adjacent to said first terminals of selected circuit elements.

* * * * *

UNITED STATES PATENT AND TRADEMARK OFFICE
CERTIFICATE OF CORRECTION

PATENT NO. : 5,053,994
DATED : October 1, 1991
INVENTOR(S) : Jeff Bullington It is certified that error appears in the above-identified patent and that said Letters Patent is hereby corrected as shown below:

Column 1, line 49, delete "energizatble" and insert therefor --energizable--.
Column 2, line 40, delete "mat ®rial" and insert therefor --material--.
Column 5, line 19, delete "circuits" and insert therefor --circuit--.

Signed and Sealed this

Eighth Day of June, 1993

*Attest:*

MICHAEL K. KIRK

*Attesting Officer*   *Acting Commissioner of Patents and Trademarks*